United States Patent [19]

Tann et al.

[11] 4,110,611

[45] Aug. 29, 1978

[54] OPTICAL POSITION TRANSDUCER

[75] Inventors: Lewis H. Tann; William L. Mueller, both of Troy; Arthur D. Vis, Warren, all of Mich.

[73] Assignee: Candid Logic, Inc., Hazel Park, Mich.

[21] Appl. No.: 641,630

[22] Filed: Dec. 17, 1975

[51] Int. Cl.² .............................................. H01J 3/14
[52] U.S. Cl. .............................. 250/237 R; 33/169 R; 33/174 L; 250/231 R
[58] Field of Search ........... 250/237 R, 237 G, 231 R, 250/553; 33/169 R, 174 L; 200/16 B, 16 D, 16 R

[56] References Cited
U.S. PATENT DOCUMENTS

| 3,529,170 | 9/1970 | Russell ............................ 250/237 G |
| 3,658,429 | 4/1972 | Zipin ............................... 250/237 G |
| 3,842,263 | 10/1974 | Kornrumpf et al. ............ 250/552 |
| 3,855,708 | 12/1974 | Tann et al. ..................... 33/174 L |
| 4,011,448 | 3/1977 | Hordeski ....................... 250/237 R |

Primary Examiner—Alfred E. Smith
Assistant Examiner—David K. Moore
Attorney, Agent, or Firm—Krass & Young

[57] ABSTRACT

A pneumatic powered probe having a rod that extends into contact with the surface of a workpiece to gauge its position includes optics and electronic circuitry for generating a binary signal proportional to the position of the probe end. The circuitry includes a parallel channel optical mask that moves with the rod between a set of light emitting diodes and a set of photo-transistors, both supported on a circuit board. Transistor circuitry supported on the board converts the outputs of the photo-transistors into a binary parallel code which may be transmitted to a remote location upon receipt of an enabling signal by a plurality of gates in the device. The rod is connected to a cylinder which cooperates with a piston fixed to the device housing. Air admitted into the chamber between the piston and cylinder force outward motion of the rod. The optical mask is supported on the cylinder and moves with it relative to the diodes and photo-transistors to generate the position related signal.

13 Claims, 6 Drawing Figures

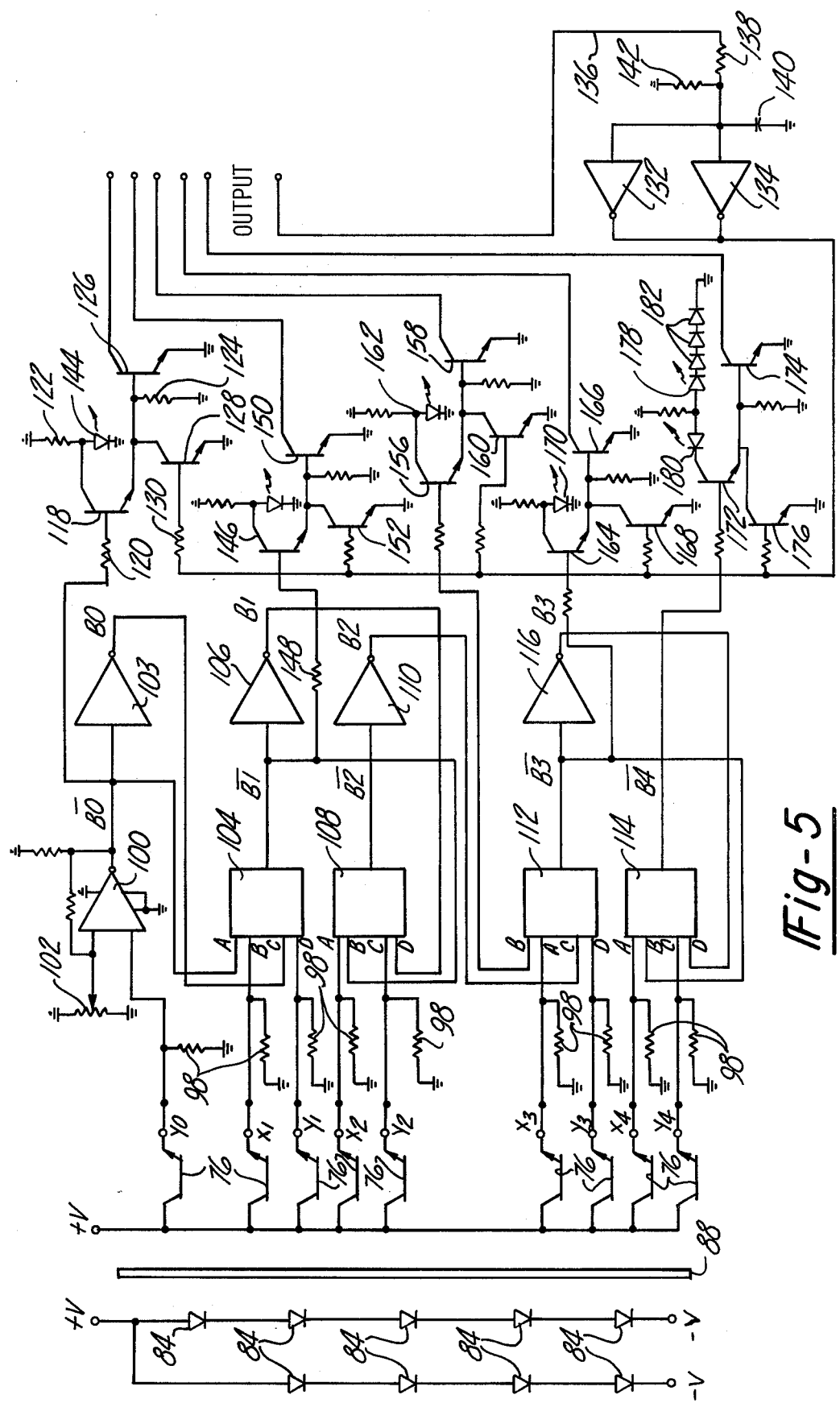

4,110,611

OPTICAL POSITION TRANSDUCER

BACKGROUND OF THE INVENTION

This invention relates to powered probes for generating electrical signals proportional to a position on a workpiece surface and more particularly to such devices employing an optical mask movable relative to a light source and photodetector for generating the electric output signal.

PRIOR ART

U.S. Pat. No. 3,855,708, assigned to the assignee of the present invention, discloses a pneumatically powered probe equipped with a brush and commutator device for generating a parallel binary electrical signal as a function of the probe position. Air pressure applied to the device causes a piston to move within the cylinder, extending a rod from the probe until it abuts a surface to be measured. The parallel binary signal representing the probe position may be provided to a digital display so that an operator can determine if the workpiece dimension is within tolerance, or to a computer where the part dimension may be recorded for later statistical analysis or recording and the like. The digital output of the device is directly compatable with computers and may be used in a direct digital feedback system.

Position transducers are also known which employ the relative motion between an optical mask, having transparent and opaque sections, and a combination of one or more light sources and photo-sensors. The position of the mask relative to the source controls the passage of light to each of the photo-sensors so the outputs of the photo-sensors vary as a function of the mask position. Devices of this type have a number of advantages over the brush and commutator type sensors, including a higher degree of precision and the elimination of the troublesome mechanical contact between the brushes and the commutator segments; however, the substitution of the optical sensor for the brush type presents a number of mechanical problems.

One of the problems relates to the length of the probe. Inherently the probe has a length equal to at least twice the stroke of its rod and if the optical mask is formed as a linear extension of the cylinder, so that the reverse end of the double-ended rod may be used to drive the movable element of the sensor, the length becomes at least three times the stroke of the rod. If the optical sensor is supported alongside the cylinder problems are encountered in connecting the rod to the movable member. Also, the optical sensors are typically relatively bulky as are their mounting structures, making it quite difficult to design a compact probe employing the optical sensors.

The present invention is broadly directed to a probe having a rod that may be urged against a part to be gauged, and an optical transducer having its movable member connected to the rod to generate a signal proportional to the rod position, which overcomes the aforementioned design problems.

SUMMARY OF THE INVENTION

The present invention employs a group of light emitting devices and a group of photo-detectors, both supported on a circuit board which contains the electronic circuitry that processes the outputs of the photo-detectors to generate a binary encoded position signal. An optical mask, supported for motion between the light sources and the photo-sensors, is connected to move with a probe rod.

The probes employ a housing, which supports the circuit board, and a rod which extends from the housing and is adapted to abut the workpiece surface to be measured. The rod may be spring loaded to move into contact with the workpiece, but in a preferred embodiment of the invention, which will subsequently be disclosed in detail, an expandable fluid chamber is formed between the rod and in the housing and air pressure introduced into the chamber extends the rod which retracts under spring bias when the air pressure is removed. In the preferred embodiment the rod is connected to the optical mask so that the mask moves linearly with the rod but in alternative embodiments suitable mechanism connected to the rod and the mask could cause the mask to undergo a rotation as the rod moves linearly.

Integration of the light source and the photo-detector with the circuit board containing the logical components for converting the photo-detector outputs into a binary coded signal representative of the rod position creates a device that is compact, easy to service, and relatively low in cost. The electronics may be fully tested and repaired outside of the probe housing and the light source and photo-sensors locked into position relative to one another by virtue of their common engagement with the circuit board, eliminating alignment problems.

The devices of the present invention are well suited for use in systems incorporating remote displays and the electronics of the preferred embodiment is designed with this function in mind. The semiconductor logic that decodes the outputs of the sensors to generate a binary position signal has its output connected to a plurality of gates which may be enabled by a common input signal from a remote device.

Other objectives, advantages and applications of the present invention will be made apparent by the following detailed description of a preferred embodiment of the invention. The description makes reference to the accompanying drawings in which:

FIG. 5 is a schematic diagram of the electronic circuitry for decoding the photo-sensor outputs employed with the device of FIG. 1.

Figure 1:
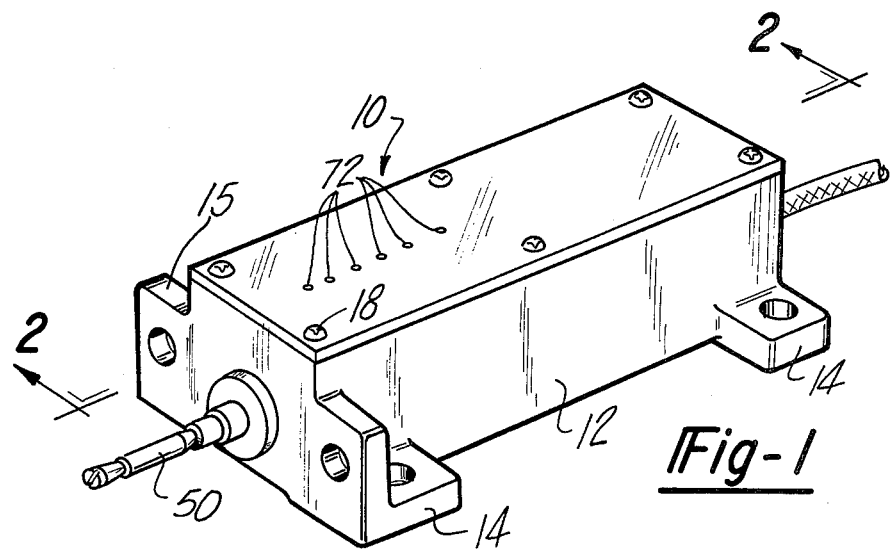
FIG. 1 is a perspective view of a linear pneumatically actuated probe having a binary digital output formed in accordance with the present invention.

The probe, generally indicated at 10, constituting the preferred embodiment of the invention, employs an elongated rectangular housing 12 having four legs 14 extending from four of its corners and two tabs 15 from the sides of its front which may be used to secure the housing to a supporting surface. The housing is substantially closed on five of its sides and open on a sixth side which may be closed off by a cover plate 16, secured to the housing 12 by screws 18.

A hollow female piston 22 is supported centrally within the housing cavity on the end of a cylindrical male support member 20. The support member has its opposite end fixed within a hole 24 formed in an end wall of the housing 12. A nut 26 mates with the threaded end 28 of the support which projects outwardly from the housing wall to retain the support in a fixed position. At the end of the support 20 adjacent to the piston 22 a seal member 30 is retained by a screw 34 which mates with an internally threaded hole in the end of the support. A fluid passage 36 is formed centrally through the support 20. A fluid line 38 connects the passage, at the outer end of the support 20, to an external source of pressurized air 40.

The piston 22 has an internal central bore 44 which rides on the support 20 and the seal 30 to slidingly support the piston within the housing. One end of the piston is closed off by a rod 46, which is fixed to the piston and passes through the end wall of the housing 12 opposite to the end wall which retains a support 20, through a sleeve bearing 48. An adjustable probe tip holder member 50 is affixed on the end of the rod 46 externally of the housing.

Figure 2:
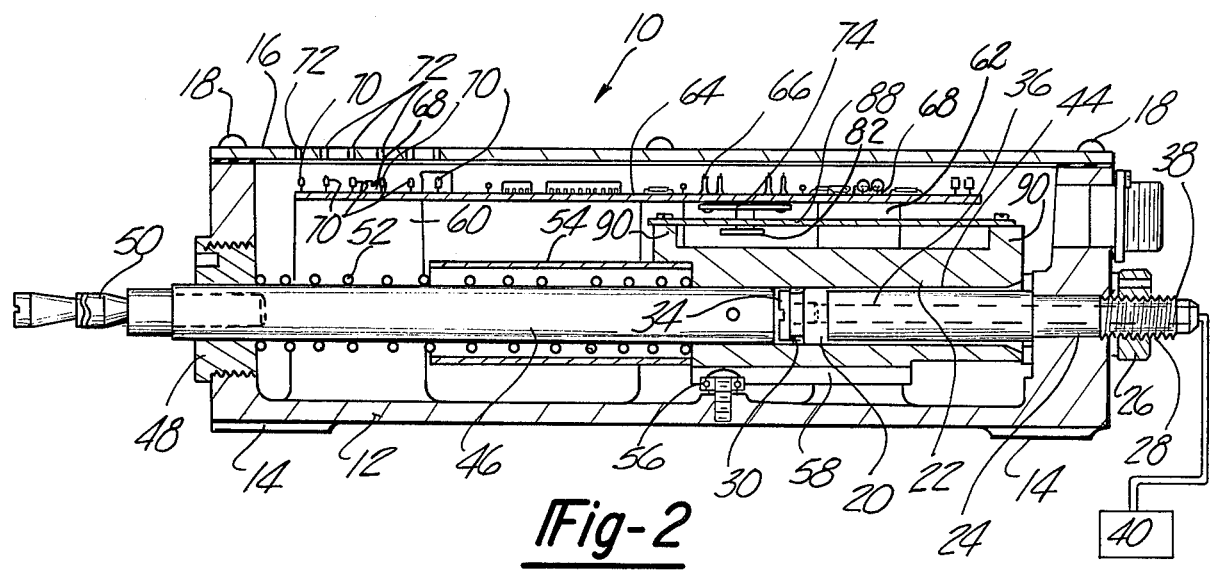
FIG. 2 is a sectional view through the probe of FIG. 1 taken along line 2—2 of FIG. 1.

A spiral wound spring 52 surrounds the section of the rod 46 within the housing and the ends of the spring are captured between the inner side of the bearing 48 and the end of the piston 22. The spring 52 urges the cylinder toward motion to the right, as viewed in FIG. 2, so that the right end of the piston is in contact with the internal end wall of the housing 12. In this position the rod 46 and the probe tip holder 50 are in a retracted position. When fluid pressure is introduced to the passage 36 through the line 38 it enters the expandable chamber formed within the piston 22 between the end of the rod 46 and the seal 30 and causes the cylinder and the rod to move to the left, as viewed in FIG. 2, against the spring bias. The probe tip holder 50 is thus extended from the housing until it contacts a surface to be gauged or, alternatively, a cylindrical stop member 54 which is affixed to the end of the piston 22, so as to surround the spring 52, abuts the interior surface of the bearing 48.

During this motion rotation of the piston 22 about its central axis is prevented by a ball bearing 56 rotatably supported on a stub shaft extending into the housing from the bottom wall. The bearing 56 makes a loose sliding fit with the opposed walls of a slot 58 formed on one side of the piston 22, parallel to its central axis.

Figure 3:
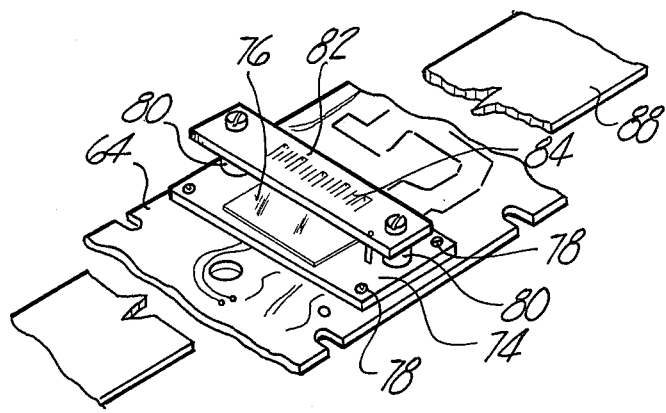
FIG. 3 is a partial perspective view of the circuit board with light source and optical sensor assembly employed in the probe of FIG. 1.

A pair of mount members 60 and 62 which extend upwardly toward the open end of the housing 12 from the opposite side support an elongated circuit board 64 on their upper ends so that the board is positioned parallel to and slightly below the cover plate 16 and extends through the major part of the length of the housing 12. The board, illustrated by itself in FIG. 3, supports and interconnects the digital components 66 which are schematically illustrated in FIG. 5. A board 64 is affixed to the mounting blocks 60 and 62 by screws 68.

Among the components supported on the upper surface of the board 64 are a plurality of light emitting diodes (LED's) arranged in a row. Holes 72 formed in the plate 16 above the LED's allow the condition of illumination of the diodes to be observed for reasons that will be detailed in connection with the description of the schematic diagram of FIG. 4.

The board 64 also supports a short transverse extending board 74 containing a row of photo-transistors 76, which is releasably attached to the main board 64 by screws 78. A pair of stand-offs 80 are affixed to the opposite sides of the board 74 and support a secondary board 82 in spaced relation to the board 74. The boards are preferably separated by approximately three-eighths inch. A plurality of light emitting diodes 84 are supported in a row on the board 82 in one-to-one relationship with the photo-transistors 76 on board 74. In the preferred embodiment of the invention there are nine photo-transistors and nine light emitting diodes.

An optical mask 88 moves in the space between the photo-transistor board 74 and the LED board 82. The mask 88 is supported by a pair of uprights 90 which extend from opposite ends of the piston 22 so that the mask 88 extends with its central axis parallel to the central axis of the piston 22 and the housing 24. It should be noted that this spacial relationship between the optical mask and the cylinder allows the length of the entire probe to be approximately equal to twice the length of the stroke of the rod 46, the minimum possible length of the device.

Figure 4:
FIG. 4 is an illustration of the optical mask employed with the preferred embodiment of the probe.

As illustrated in FIG. 4, the mask 88 consists of an elongated rectangle of transparent plastic or glass, coated with an opaque paint and having nine channels of binary coding extending along its length in the form of sections 92 in which the opaque masking is removed. Alternatively, other mask structures could be used, such as perforate metal mask to form the coded pattern. These nine longitudinal channels are spaced in the same manner as the photo-transistors 76 and the LEDS 84. Accordingly, the mask controls the optical path between each of the LEDS and their companion photo-transistors. The longitudinal position of the mask and accordingly the extension of the probe rod 46, controls the output signals from the photo-transistors 76.

In FIG. 4 the nine coding channels are denoted Y0, Y1, Y2, Y3, Y4, X1, X2, X3 and X4. The Y0 channel is used to generate the least significant digit of the binary output code, and also condition the switching of the output for the more significant digits, as will be detailed in connection with the description of the schematic diagram of FIG. 5. The other eight channels are arranged in four pairs: X1 and Y1; X2 and Y2; X3 and Y3; and X4 and Y4. These pairs respectively encode the four most significant digits of the output code. The two members of each pair are identical to one another but are displaced from one by approximately one-quarter of the repeated pattern length.

Referring to FIG. 5, the nine LED's 84 are arranged in two series chains, one consisting of four LED's and the other containing five LED's connected in parallel with one another, across the appropriate power supply. The photo-transistors 76 each have their collector connected to a positive voltage and their emitters connected to ground through one of a group of resistors 98. The emitters are labelled using the nomenclature Y0–Y4 and X1–X4 based upon the optical channel of the mask 88 which controls the application of light to that photo-transistor from its associated LED.

The emitter of the photo-transistor Y0 is connected to an operational amplifier 100 connected as a comparator and having its other input from a manually adjustable resistance 102. The setting of the resistance 102 controls the level of the emitter signal from Y0 which produces an output from the inverter 100. This output is applied to an inverter 103. The output of the inverter 103 is termed B0 and plotted in FIG. 6 in spacial relationship to the mask 88. The output of the inverter 100 and its inverse, or the output of the inverter 103, are applied to two of the four inputs of a digital logic device 104. The device implements the equation $Z = \overline{(A \cdot B) + (C \cdot D)}$. The output of the inverter 100 is applied to the A input and the output of the inverter 102 is applied to the C input. The B and D inputs respectively receive the outputs of the emitters of the photo-transistors X1 and Y1. Accordingly, the logic device 104 provides an output when the emitter of photo-transistor Y0 is above the reference level and the emitter of photo-transistor X1 is high or when the output of Y0 is below the reference level and the emitter of photo-transistor Y1 is high. The output of the logical device 104 is termed $\overline{B2}$ and is applied to an inverter 106 which generates the function of B1. That function is plotted in FIG. 6 in spacial relation to the mask.

The output of the logic unit 104, $\overline{B1}$, is provided to the B input of a second logic unit 108 which implements the same logical function as 104. The output of the inverter 106, B1, is provided to the B input of logic unit 108. The A and C inputs come from the emitters of photo-detectors X2 and Y2 respectively. The output of logic unit 108, termed $\overline{B2}$ is provided to an inverter 110 and to the B input of a third logic unit 112 which is identical to the units 104 and 108. The output of the inverter 110, termed B2, is plotted in FIG. 6 in spacial relationship to the mask 88, and this signal is provided to the C input of the logic unit 112.

Figure 6:
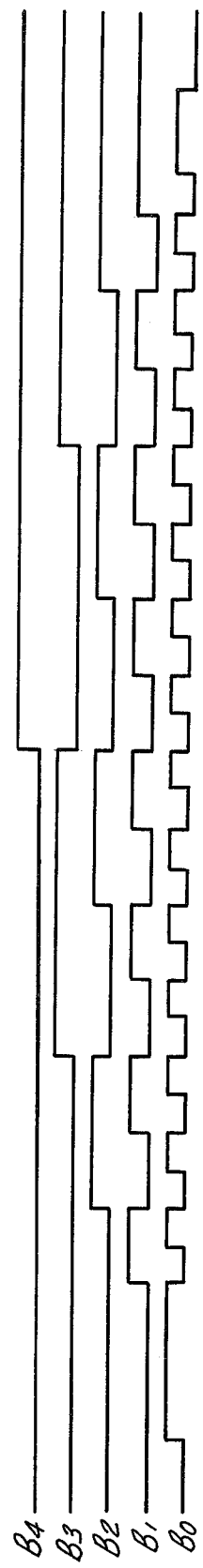
FIG. 6 is a plot of wave-forms occurring in the circuit of FIG. 4 for various positions of the rod of the probe device.

The A and D inputs of the logic unit 112 are derived from the emitters of photo-transistors X3, Y3 respectively. The output of the logic unit B3, is provided to the B input of a fourth logic unit 114, identical to the units 104 and 112, as well as to an inverter 116. The output of the inverter 116, termed $\overline{B3}$, and plotted in FIG. 6, is provided to the C input of the logic unit 114. The A and D inputs of the logic unit 114 are derived from the emitters of photo-transistors X4 and Y4 respectively. The output of the logic unit 114 is termed B4 and its inversion, $\overline{B4}$, is plotted in FIG. 6.

The signal $\overline{B0}$ is also provided to the base of a transistor 118 through a current limiting resistor 120. Transistor 118 has its collector connected to a positive voltage through a resistor 122 and its emitter connected to ground through a relatively high resistance 124. The emitter is also connected to the base of an output transistor 126 that has its collector connected to an output representing the least significant bit of the five-bit binary code representing the position of the probe rod. This quantity also represents $\overline{B0}$. When the input to the transistor 118 base, $\overline{B0}$, is high, that transistor is conductive and causes transistor 126 to be conductive, dropping the output, B0, to substantially ground level; when B0 is low the voltage at the collector of transistor 126 is relatively high.

Another NPN transistor 128 has its collector connected to the base of transistor 126 and its emitter connected to ground. Accordingly, when a signal applied to the base of transistor 128 through resistor 130 is high, the transistor 128 is conductive, bypassing the current normally supplied to the base of transistor 126 so that its collector remains high. In the absence of the signal on the base of transistor 128 the collector of transistor 126 can go low.

The signal to resistor 130 is derived from the outputs of a pair of inverters 132 and 134 which act as buffers for an input signal on line 136 which is applied through a resistor 138 to one side of a capacitor 140 which has its other side connected as inputs to the two inverters 132 and 134 and is also connected to positive voltage through a resistor 142. The signal on line 136 comes from an outside circuit and acts as an enabling signal for output transistor 126 and other output driving transistors for the higher digits which will subsequently be described.

A light emitting diode 144 is connected between the collector of transistor 118 and ground and accordingly is energized whenever the transistor 118 is not conductive, or in accordance with the function B0. This LED is supported on the circuit board 64 below one of the openings 75 in the face plate 16 and accordingly is visible through the plate. It provides a visual indication of the signal B0.

In a similar manner, the signal $\overline{B1}$ from the output of logic unit 104 is provided to a transistor 146 through a resistor 148. Transistor 146 drives an output transistor 150 and this signal is controlled by an enabling transistor 152. A light emitting diode 154 positioned on the circuit board 64 beneath one of the holes 75 in the face plate visually signals B1.

The signal $\overline{B2}$, derived from the output of the logic unit 108 is provided to the base of a transistor 156 which drives an output transistor 158. The transistor 160 is driven by the outputs of the inverters 132 and 134 and controls the provision of that signal to the driving output and a light emitting diode 162 provides a visual indication of the signal B2 through the face plate.

The signal $\overline{B3}$ drives transistor 164 which drives output transistor 166. The signal is controlled by an enabling transistor 168 and is visually indicated by a LED 170.

The signal $\overline{B4}$ drives transistor 172 which in turn drives the output transistor 174. This signal is enabled by transistor 176. The light emitting diode arrangement in the collector circuit of transistor 172 differs from the other LED circuits. A LED 178, which is the equivalent of the LED's 144, 154, 162 and 170, provides a visual indication of the most significant digit of the output signal B4. It has its cathode connected to the cathode of another LED 180 which has its anode connected to the collector of transistor 172. Thus, when LED 178 is not conductive, LED 180 is conductive. The two are alternatively conductive and are used to indicate the mid-point of the probe rod range. One LED is conductive during the first half of the range and the other is conductive during the second half. In systems wherein the zero point of the rod is selected at this mid-point these two LED's indicate which half of the range the probe is in, its negative half or its positive half. Three diodes 182 connected in series between the anode of the LED 178 and ground are level shifting diodes which insure that LED 178 turns off when LED 180 turns on.

It should be noted that the LED's 144, 154, 162, 170 and 180 indicate status of their outputs even when the associated enabling transistors 128, 152, 160 and 176 inhibit outputs from the output transistors. Since the indicator LED's are connected between the collectors of the first driving transistor and ground, a relatively constant current is applied to these LED circuits even during switching of the enabling transistors and the output transistors.

Having thus described out invention, we claim:

1. A transducer for generating a binary, parallel, multi-digit electrical output signal proportional to the position of a part relative to tooling comprising: a housing, fixed with respect to the tooling; an elongated rod supported for motion with respect to the housing; means within the housing for urging motion of the rod to cause one end of the rod to contact the part; a substantially planar printed circuit board fixed in the housing and supporting a plurality of electronic components interconnected to electronic circuitry; an optical source supported on the board and adapted to generate a line of optical radiation, the line extending parallel to the board and normally to the motion of the rod; a plurality of optical detectors arrayed in a line extending parallel to the line of optical radiation and separated from said line of optical radiation in a direction normal to said line and to the plane of said circuit board, said detectors being interconnected with said electronic circuitry; an optical mask having opaque and transparent sections arranged in a binary code with successive parallel binary digits arrayed transverse to an elongate axis of the mask, the optical mask being supported between said line of radiation and said line of radiation detectors; and a connection between the rod and the mask causing motion of the mask along its elongated axis upon motion of the rod whereby the radiation reaching the detectors is a function of the position of the rod.

2. The transducer of claim 1 wherein the optical source consists of a plurality of substantial point sources arrayed along said line of optical radiation.

3. The transducer of claim 2 wherein said optical point sources are generated by light emitting diodes.

4. The transducer of claim 1 wherein said plurality of optical detectors are supported on the circuit board.

5. The transducer of claim 1 wherein said means for urging motion of the rod to cause one end of the rod to contact the part includes a source of pressurized fluid; an expandable chamber formed within the housing; and means for admitting fluid from the source to the expandable chamber.

6. The transducer of claim 1 wherein said means for urging motion of the rod includes a tubular female piston affixed to the end of the rod opposite to the end which contacts the part; a male support fixed with respect to the housing and extending into the piston to form an expandable chamber; and means for the quantity of fluid within the expandable chamber to cause motion of the rod relative to the housing.

7. The transducer of claim 6 wherein said optical mask is affixed to said piston with its elongate axis parallel to that of the piston.

8. The transducer of claim 7 wherein said optical mask is affixed to the exterior of the piston with its ends supported within the length bounded by the ends of the piston.

9. The transducer of claim 1 wherein said circuitry includes a plurality of semi-conductor devices connected to the optical detector devices so that the output states of the semi-conductor devices represent a coded form of the position of the rod.

10. The transducer of claim 9 including an output connector and a plurality of gate devices, controlled by a common signal, each connected to receive the output of one of said semi-conductor devices and to controllably apply such outputs to the output connector.

11. A transducer probe comprising: a housing; a male support fixed within the housing; a female piston movably supported within the housing, surrounding the male support, with the support engaging the piston's interior diameter; a rod fixed to the piston and extending out of the housing; means for applying fluid pressure between the piston and the support to cause motion of the piston relative to the housing; and a position transducer having a fixed member and a movable member and operative to provide a digital electrical signal proportional to the position of the movable member relative to the fixed member, the fixed member being fixed with respect to the housing and the movable member being supported on the exterior of the piston.

12. The probe of claim 11 wherein the fixed member of the transducer includes a light source and a photodetector in spaced relation to one another and the movable member consists of an optical mask supported for motion between said light source and said photo-detector.

13. The probe of claim 12 including a circuit board containing electronic components connected to the photo-detector, the circuit board supporting both the light source and the photo-detector.

* * * * *

UNITED STATES PATENT OFFICE
CERTIFICATE OF CORRECTION

Patent No. 4,110,611          Dated August 29, 1978

Inventor(s) Lewis H. Tann, William L. Mueller and Arthur D. Vis

It is certified that error appears in the above-identified patent and that said Letters Patent are hereby corrected as shown below:

Column 5, line 29 "B3" should be --$\overline{B3}$--.

line 32 "$\overline{B3}$" shoulb be --B3--.

line 36 "B4" should be --$\overline{B4}$--.

line 37 "$\overline{B4}$" should be --B4--.

line 47 "$\overline{B0}$" should be --B0--.

line 51 "B0" should be --$\overline{B0}$--.

Signed and Sealed this

Eighth Day of May 1979

[SEAL]

Attest:

RUTH C. MASON
*Attesting Officer*

DONALD W. BANNER
*Commissioner of Patents and Trademarks*